(12) United States Patent
Minamida et al.

(10) Patent No.: US 10,186,433 B2
(45) Date of Patent: Jan. 22, 2019

(54) SUBSTRATE PROCESSING APPARATUS

(71) Applicant: Tokyo Electron Limited, Tokyo (JP)

(72) Inventors: Junya Minamida, Koshi (JP); Daisuke Aoki, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 578 days.

(21) Appl. No.: 14/923,524

(22) Filed: Oct. 27, 2015

(65) Prior Publication Data

US 2016/0121373 A1 May 5, 2016

(30) Foreign Application Priority Data

Oct. 31, 2014 (JP) ................. 2014-223256

(51) Int. Cl.
*H01L 21/67* (2006.01)
*B08B 15/02* (2006.01)

(52) U.S. Cl.
CPC .. *H01L 21/67017* (2013.01); *H01L 21/67028* (2013.01); *B08B 15/02* (2013.01)

(58) Field of Classification Search
CPC ....... H01L 21/677; H01L 21/02; H01L 21/67; H01L 21/67028
USPC .................... 414/217, 222.01, 403
See application file for complete search history.

(56) References Cited

U.S. PATENT DOCUMENTS

| 2006/0165409 A1* | 7/2006 | Akimoto ................. H01L 21/00 396/611 |
| 2008/0181750 A1* | 7/2008 | Moriya ............. H01L 21/67126 414/217.1 |
| 2011/0079252 A1* | 4/2011 | Minamida ......... H01L 21/67051 134/94.1 |
| 2011/0103923 A1* | 5/2011 | Minamida ......... H01L 21/67196 414/222.01 |

FOREIGN PATENT DOCUMENTS

JP 2011-119650 A 6/2011

* cited by examiner

*Primary Examiner* — Michael Jennings
(74) *Attorney, Agent, or Firm* — Pearne & Gordon LLP

(57) ABSTRACT

Particles can be suppressed from adhering to a substrate. A substrate processing apparatus includes a carry-in/out chamber, a transfer chamber, and a delivery chamber. In the carry-in/out chamber, the substrate is carried in and out with respect to a carrier, and in the transfer chamber, a transfer path for the substrate toward a substrate processing chamber, where a predetermined process is performed on the substrate, is formed. Further, the delivery chamber is arranged between the carry-in/out chamber and the transfer chamber. Moreover, an internal pressure of the delivery chamber is higher than an internal pressure of the carry-in/out chamber and an internal pressure of the transfer chamber.

11 Claims, 6 Drawing Sheets

SUBSTRATE PROCESSING APPARATUS

CROSS-REFERENCE TO RELATED APPLICATION

This application claims the benefit of Japanese Patent Application No. 2014-223256 filed on Oct. 31, 2014, the disclosures of which are incorporated herein by reference.

TECHNICAL FIELD

The embodiments described herein pertain generally to a substrate processing apparatus.

BACKGROUND

Conventionally, there has been known a substrate processing apparatus that performs a predetermined substrate process, such as a cleaning process, to a substrate, such as a semiconductor wafer or a glass substrate, while transferring the substrate under a clean environment in which a clean air flow is formed.

The substrate processing apparatus includes, for example, a carry-in/out chamber where the substrate is carried in/out with respect to a carrier, a transfer chamber communicating with the carry-in/out chamber, and multiple substrate processing chambers arranged along the transfer chamber. Further, within the carry-in/out chamber and the transfer chamber, the clean air flow is formed by using a fan filter unit or the like (see, for example, Patent Document 1).

The substrate is transferred between the carrier and the substrate processing chambers by a substrate transfer device or the like provided within the transfer chamber while suppressing particles from adhering to the substrate under the clean environment.

Further, a delivery chamber is provided between the carry-in/out chamber and the transfer chamber and configured to enable the carry-in/out chamber and the transfer chamber to communicate with each other. Actually, the delivery chamber serves as a buffer region, and within the delivery chamber, there is provided a delivery table capable of supporting multiple substrates, which are taken out of the carrier by the substrate transfer device provided within the carry-in/out chamber, at the same time. The substrate transfer device within the transfer chamber transfers the substrates to the respective substrate processing chambers while taking out each substrate from the delivery table.

Patent Document 1: Japanese Patent Laid-open Publication No. 2011-119650

SUMMARY

However, in the case of using the above-described conventional technology, although temporarily, the substrate stays in the delivery chamber which serves as the buffer region, so that particles are likely to adhere thereto. Therefore, there is a requirement for further suppressing the particles from adhering to the substrate.

An exemplary embodiment provides a substrate processing apparatus capable of further suppressing the particles from adhering to a substrate.

According to the exemplary embodiment, the substrate processing apparatus includes a carry-in/out chamber, a transfer chamber, and a delivery chamber. In the carry-in/out chamber, a substrate is carried in and out with respect to a carrier. In the transfer chamber, a transfer path for the substrate toward a substrate processing chamber, where a predetermined process is performed on the substrate, is formed. Further, the delivery chamber is arranged between the carry-in/out chamber and the transfer chamber. Moreover, an internal pressure of the delivery chamber is higher than an internal pressure of the carry-in/out chamber and an internal pressure of the transfer chamber.

According to the exemplary embodiment, it is possible to further suppress the particles from adhering to the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
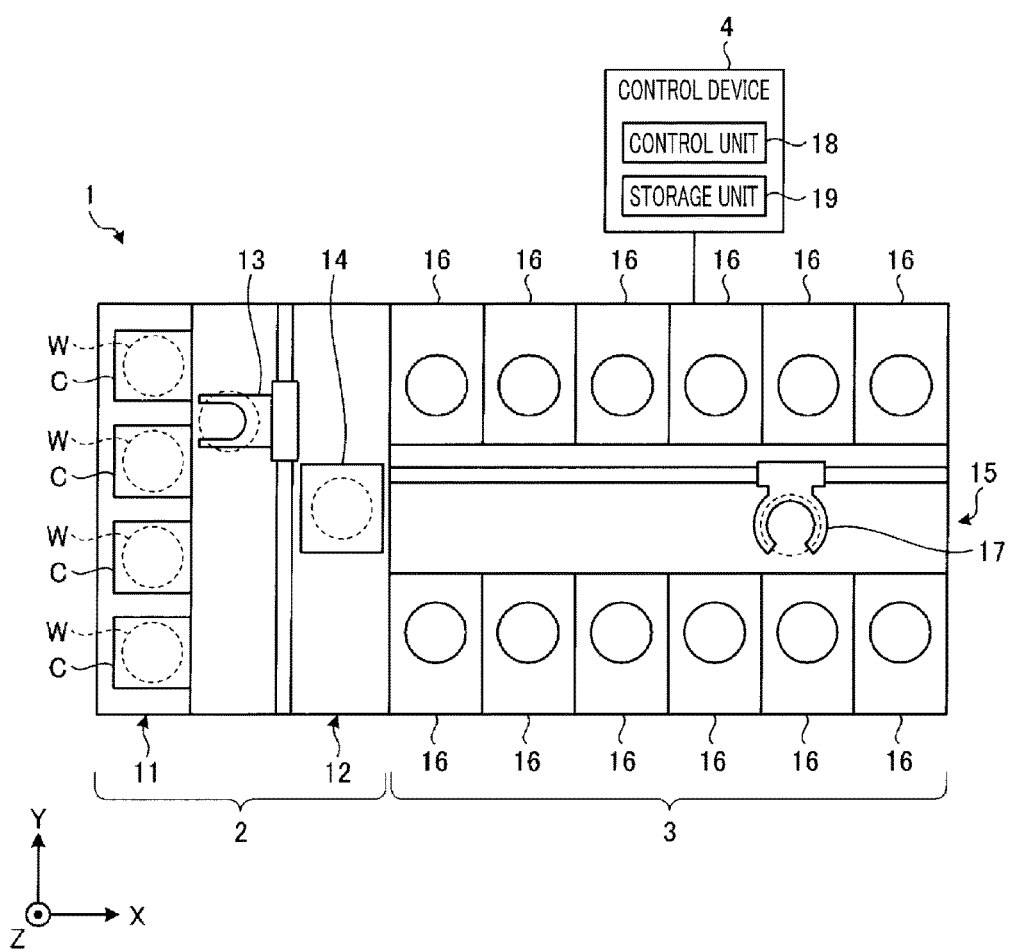
FIG. 1 is a plan view illustrating an outline of a substrate processing system according to an exemplary embodiment.

In the following, a substrate processing apparatus described by the present disclosure will be described in detail with reference to the accompanying drawings. The present disclosure is not limited to the following exemplary embodiments.

Further, in the following, an example of a substrate processing apparatus will be described as "substrate processing system". Furthermore, in each drawing referred to in the following description, as for components provided in plural in number, reference numerals may be assigned to only some of the multiple components, and assignment of reference numerals to the other components may be omitted.

In this case, it is assumed that some components assigned with reference numerals have the same configuration with the other components.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
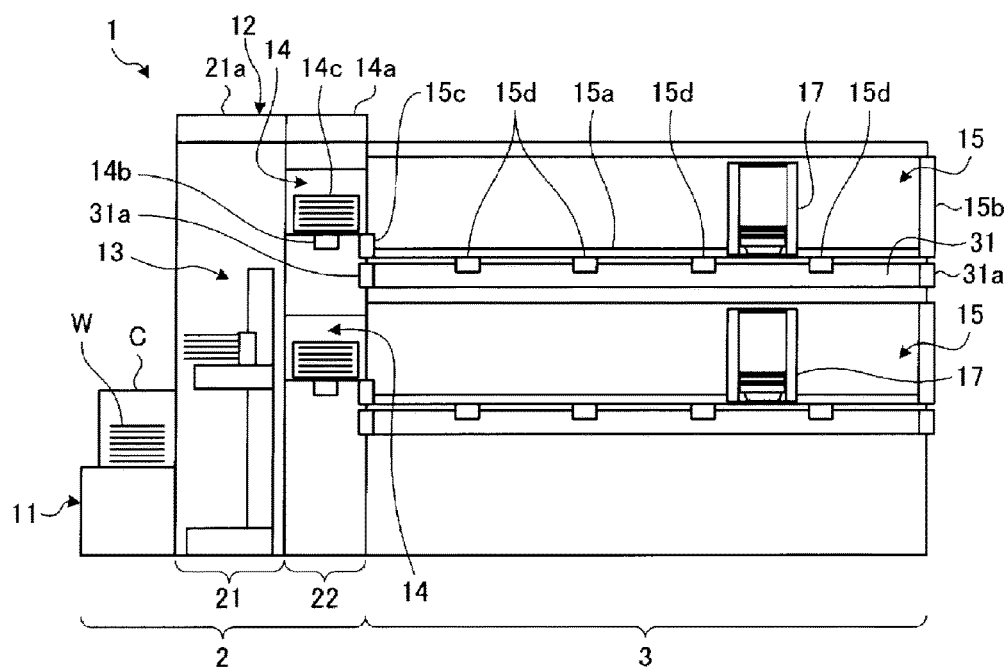
FIG. 2 is a schematic diagram illustrating an example specific configuration of the substrate processing system.

Hereinafter, a configuration of the substrate processing system 1 will be described in more detail with reference to FIG. 2. FIG. 2 is a schematic diagram illustrating an example specific configuration of the substrate processing system. Further, FIG. 2 is a side view of briefly showing the substrate processing system 1 as seen through from the negative Y-axis direction. Furthermore, illustration of the processing unit 16 (corresponding to an example of "a substrate processing chamber") is omitted.

Firstly, the carry-in/out station 2 will be described in more detail. As illustrated in FIG. 2, the transfer section 12 of the carry-in/out station 2 includes a carry-in/out chamber 21 and a delivery station 22. The carry-in/out chamber 21 is configured to accommodate the above-described substrate transfer device 13. At a ceiling portion of the carry-in/out chamber 21, a FFU (Fan Filter Unit) 21a is provided.

The delivery station 22 includes the above-described delivery unit 14. The delivery unit 14 is arranged between the carry-in/out chamber 21 and the above-described transfer section 15. Further, the delivery unit 14 serves as a buffer region configured to enable the carry-in/out chamber 21 and the transfer section 15 to communicate with each other, and corresponds to an example of "a delivery chamber".

The delivery unit 14 may be provided in plural in number at multiple levels along a height direction of the delivery station 22 in the same manner as the above-described transfer section 15 which can be provided in plural in number at multiple levels along the height direction. Further, in FIG. 2, two delivery units 14 are provided to correspond to two transfer sections 15 provided along the height direction, but the number of the delivery units 14 is not limited thereto.

The delivery unit 14 is connected to a FFU 14a and an exhaust device 14b. The FFU 14a is arranged above the delivery unit 14, for example, at a ceiling portion of the delivery station 22 as illustrated in FIG. 2, and connected to the delivery unit 14. The exhaust device 14b is arranged under the delivery unit 14 and directly connected to, for example, a lower portion of the delivery unit 14 as illustrated in FIG. 2.

Further, within the delivery unit 14, a delivery table 14c is provided. The delivery table 14c is configured to support the wafer W. Further, the delivery table 14c includes multiple placing shelves provided at multiple levels along the height direction. Since the wafers W are placed on the respective placing shelves, the multiple wafers W can be supported at the same time. Further, within the delivery unit 14, a down flow of clean air is formed by the above-described FFU 14a and exhaust device 14b. Details thereof will be described later with reference to FIG. 4A and FIG. 4B.

Hereinafter, the processing station 3 will be described in more detail. As illustrated in FIG. 2, the processing station 3 includes the transfer section 15 and an exhaust line 31. The transfer section 15 corresponds to an example of "a transfer chamber". Further, although described above, the transfer section 15 may be provided in plural in number at multiple levels along a height direction of the processing station 3.

In each of the transfer sections 15, the above-described substrate transfer device 17 is accommodated. The substrate transfer device 17 is moved in a horizontal direction (for example, the X-axis direction in FIG. 2) along a transfer path 15a formed within the transfer section 15.

Further, the transfer section 15 includes a FFU 15b and an exhaust device 15c. The exhaust device 15c is arranged at a side wall of the transfer section 15 (corresponding to an example of "an opening side wall") including an opening communicating with the delivery unit 14 of the transfer section 15. The FFU 15b is arranged at a side wall thereof (corresponding to an example of "a facing side wall") facing the opening side wall.

Within the transfer section 15, a side flow of clean air is formed along an extension direction of the transfer path 15a by the FFU 15b and the exhaust device 15c. Details thereof will be described later with reference to FIG. 5A and FIG. 5C.

Further, the transfer section 15 includes an exhaust device 15d. The exhaust device 15d may be plural in number, and the exhaust devices 15d are arranged along, for example, the extension direction of the transfer path 15a as illustrated in FIG. 2, and each of the exhaust devices 15d is connected to the exhaust line 31.

The exhaust line 31 is provided under each of the transfer sections 15 along the extension direction of the transfer path 15a. Further, exhaust devices 31a are respectively provided at both ends of the exhaust line 31.

The exhaust device 31a is configured to exhaust air in the vicinity of the substrate transfer device 17 discharged to the exhaust line 31 by the exhaust device 15d. Details thereof will be described later with reference to FIG. 5B and FIG. 5C.

With this configuration, in the substrate processing system 1 according to the exemplary embodiment, an internal pressure of the delivery unit 14 is set to be higher than an internal pressure of the carry-in/out chamber 21 and an internal pressure of the transfer section 15 in order to further suppress the particles from adhering to the wafer W. Details thereof will be described with reference to FIG. 3A and FIG. 3B.

Figure 3A:
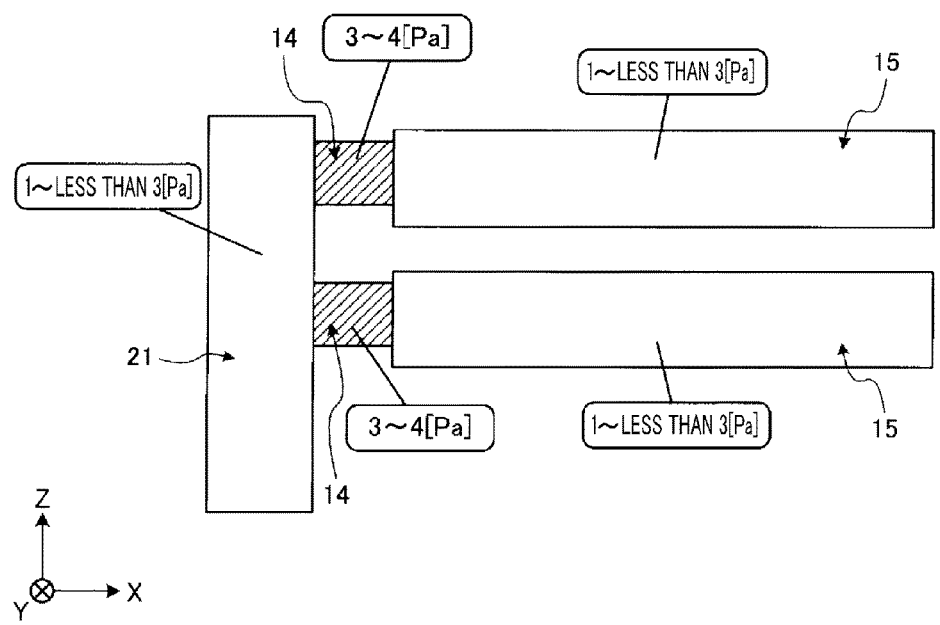
FIG. 3A is a schematic diagram illustrating internal pressure differences among a delivery unit, a carry-in/out chamber, and a transfer section.
Figure 3B:
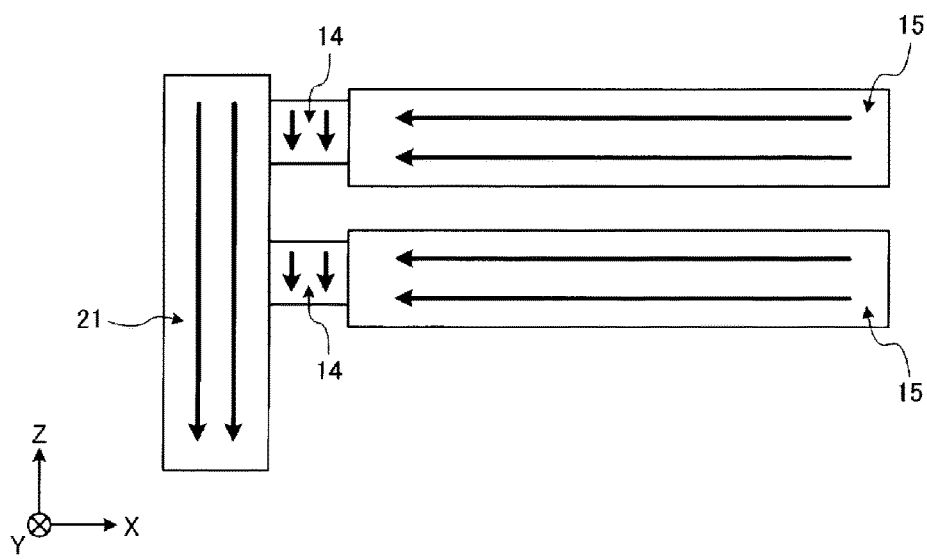
FIG. 3B is a schematic diagram illustrating a direction of an air flow in each of the delivery unit, the carry-in/out chamber, and the transfer section.

FIG. 3A is a schematic diagram illustrating internal pressure differences among the delivery unit 14, the carry-in/out chamber 21, and the transfer section 15. Further, FIG. 3B is a schematic diagram illustrating a direction of an air flow in each of the delivery unit 14, the carry-in/out chamber 21, and the transfer section 15.

As illustrated in FIG. 3A, in the substrate processing system 1, the internal pressure of the delivery unit 14 is maintained to be higher than the internal pressure of the carry-in/out chamber 21 and the internal pressure of the transfer section 15. For example, as illustrated in FIG. 3A, each of the internal pressure of the carry-in/out chamber 21 and the internal pressure of the transfer section 15 is maintained in the range of "1 Pa to less than 3 Pa", and the internal pressure of the delivery unit 14 is maintained in the range of "3 Pa to 4 Pa".

Thus, it is possible to suppress introduction of particles from the carry-in/out chamber 21 and the transfer section 15 into the delivery unit 14 where the wafer W temporarily stays. Therefore, it is possible to further suppress the particles from adhering to the wafer W.

Further, the specific values shown in FIG. 3A are just examples for illustrating the internal pressure differences among the delivery unit 14, the carry-in/out chamber 21, and the transfer section 15, but do not limit actual values. Furthermore, although the internal pressure of the carry-in/out chamber 21 and the internal pressure of the transfer section 15 are in the same range in FIG. 3A, these internal pressures just need to be lower than at least the internal pressure of the delivery unit 14 and are not necessarily in the same range.

The internal pressure differences among the delivery unit 14, the carry-in/out chamber 21, and the transfer section 15 are caused by air volumes and directions of the clean air flows respectively formed in the delivery unit 14, the carry-in/out chamber 21, and the transfer section 15.

To be specific, as illustrated in FIG. 3B, in each of the delivery units 14, there is formed the down flow flowing from the top of the delivery unit 14 toward the bottom thereof. The down flow functions as an air curtain that separates the delivery unit 14 from the carry-in/out chamber 21 and the transfer section 15. Further, the internal pressure of the delivery unit 14 is adjusted to be higher than the internal pressure of the carry-in/out chamber 21 and the internal pressure of the transfer section 15 by an air volume of the down flow or the like.

Further, in the carry-in/out chamber 21, a down flow is formed by the FFU 21a (see FIG. 2) and an exhaust device (not shown) provided under the carry-in/out chamber 21, in the same manner as the delivery unit 14. The internal pressure of the carry-in/out chamber 21 is adjusted to be lower than the internal pressure of the delivery unit 14 by an air volume of the down flow or the like.

Furthermore, in each of the transfer sections 15, there is formed the side flow in a substantially horizontal direction along the extension direction (X-axis direction) of the transfer section 15. The internal pressure of the transfer section 15 is adjusted to be lower than the internal pressure of the delivery unit 14 by an air volume of the side flow or the like.

Figure 4A:
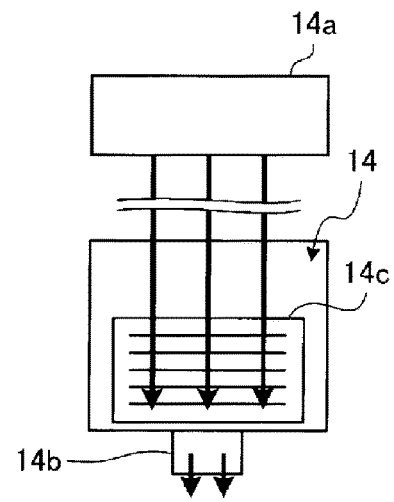
FIG. 4A is a first schematic diagram illustrating a configuration of an air supply/exhaust device of the delivery unit.
Figure 4B:
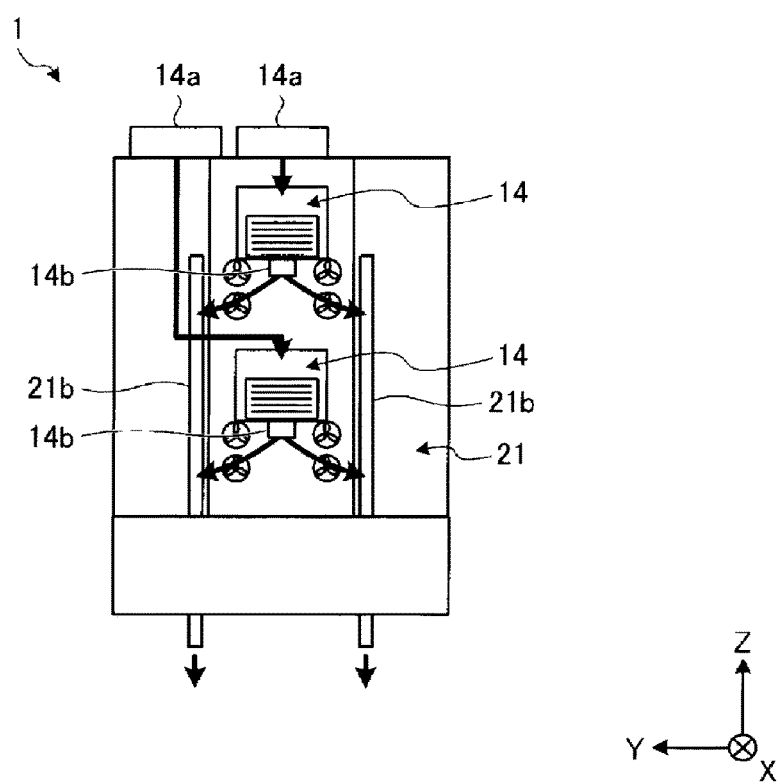
FIG. 4B is a second schematic diagram illustrating the configuration of the air supply/exhaust device of the delivery unit.

Hereinafter, a configuration of an air supply/exhaust device configured to form the down flow in the delivery unit 14 will be described in more detail with reference to FIG. 4A and FIG. 4B. FIG. 4A and FIG. 4B are first and second schematic diagrams illustrating a configuration of the air supply/exhaust device of the delivery unit 14, respectively. Further, FIG. 4B is a schematic front view of briefly illustrating the substrate processing system 1 as seen through from the negative X-axis direction.

As illustrated in FIG. 4A, in the delivery unit 14, clean air is supplied by the FFU 14a and this air is exhausted by the exhaust device 14b. As a result, the down flow is formed within the delivery unit 14 where the delivery table 14c is provided.

If multiple delivery units 14 are provided, the air supply/exhaust device is provided in each of the delivery units 14. For example, as illustrated in FIG. 4B, if two delivery units 14 are provided at multiple levels, two FFUs 14a are arranged at the ceiling portion of the delivery station 22 (see FIG. 2) along the Y-axis direction, and one of the two FFUs 14a is connected to the delivery unit 14 disposed at an upper level and the other one is connected to the delivery unit 14 disposed at a lower end.

Further, in each of the delivery units 14, air is supplied by the individual FFU 14a and the air is exhausted by the individual exhaust device 14b, so that the individual down flow is formed therein. Since the delivery units 14 include the individual air supply/exhaust devices as such, the internal pressure of each delivery unit 14 can be minutely adjusted according to a difference between the units such as a position of the delivery unit 14 or a difference in a length of an air supply path from the FFU 14a.

Furthermore, the exhaust of the air may be carried out by each of the exhaust devices 14b in the following manner. As illustrated in FIG. 4B, an exhaust path 21b may be provided within the carry-in/out chamber 21 and the air flow may be guided toward a lower side of the carry-in/out chamber 21 while being rectified through the exhaust path 21b, and then, exhausted to the outside of the apparatus (the outside of the substrate processing system 1).

Figure 5A:
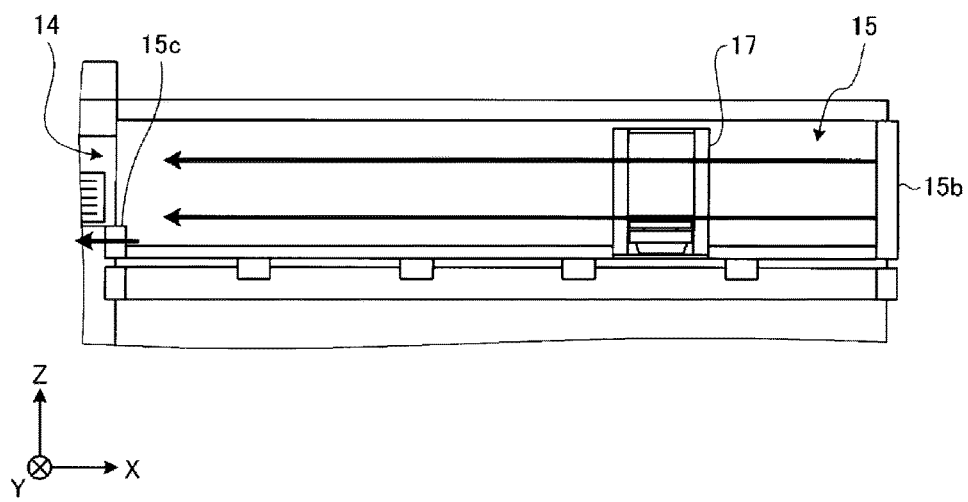
FIG. 5A is a first schematic diagram illustrating a configuration of an air supply/exhaust device of the transfer section.
Figure 5B:
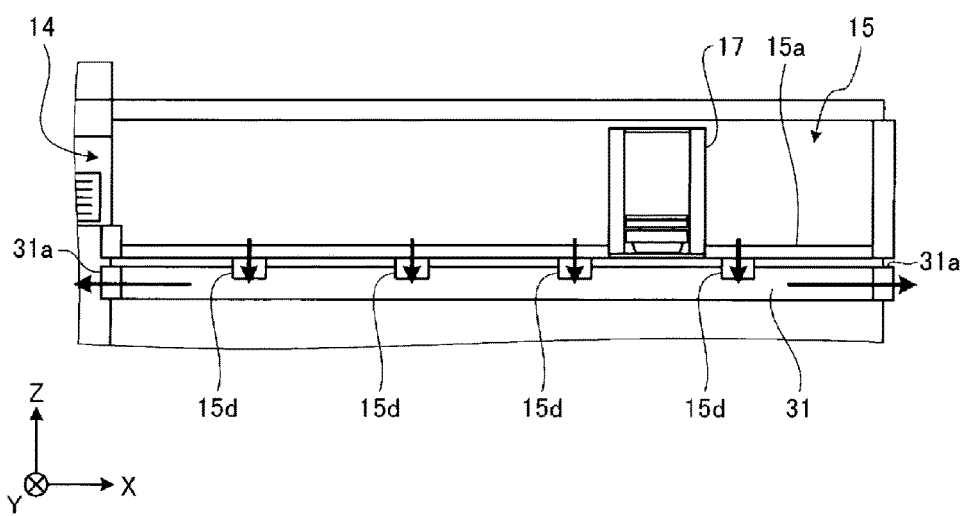
FIG. 5B is a second schematic diagram illustrating the configuration of the air supply/exhaust device of the transfer section.
Figure 5C:
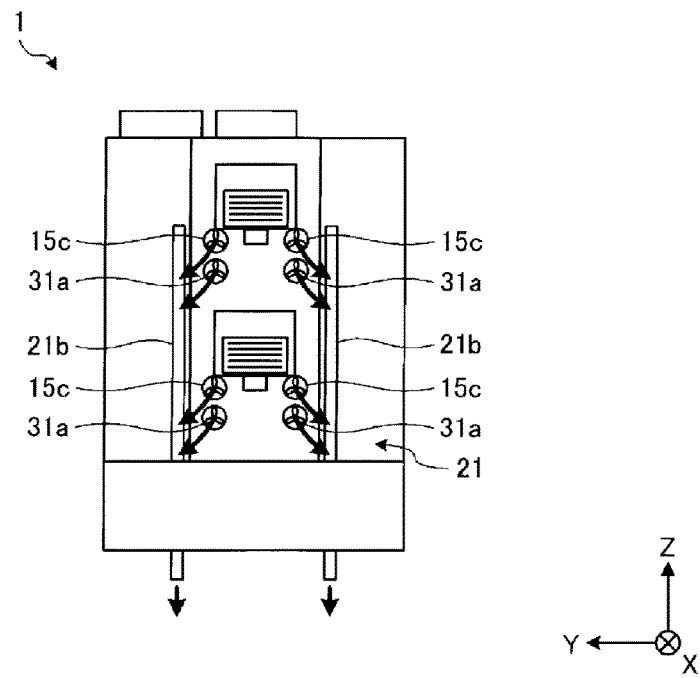
FIG. 5C is a third schematic diagram illustrating the configuration of the air supply/exhaust device of the transfer section.

Hereinafter, a configuration of an air supply/exhaust device of the transfer section 15 will be described in more detail with reference to FIG. 5A to FIG. 5C. FIG. 5A to FIG. 5C are first to third schematic diagrams illustrating a configuration of the air supply/exhaust device of the transfer section 15, respectively. Further, like FIG. 4B, FIG. 5C is a front view of briefly illustrating the substrate processing system 1 as seen through from the negative X-axis direction.

As illustrated in FIG. 5A, in the transfer section 15, clean air is supplied by the FFU 15a and this air is exhausted by the exhaust device 15b. As a result, the side flow is formed in the substantially horizontal direction from the positive X-axis direction toward the negative X-axis direction within the transfer section 15 where the substrate transfer device 17 is accommodated.

Herein, it is desirable that the FFU 15b is provided to supply the air from an approximately entire surface of the above-described facing side wall. Thus, it is possible to form a substantially uniform air flow over the horizontal cross section of the transfer section 15. Therefore, it is possible to form a clean environment in which a turbulent flow is difficult to form, i.e., the efficient adjustment can be performed.

Since the air supply/exhaust device can be arranged in a range of a vertical width (a width in a vertical direction) shorter than a forward/backward width (a width in the extension direction) of the transfer section 15, it is possible to promote a scale-down of the air supply/exhaust device as compared with, for example, the configuration where the down flow is formed within the transfer section 15. Thus, it is possible to reduce manufacturing costs and power consumption of the substrate processing system 1. Further, in the case of the side flow illustrated in FIG. 5A, the above-described opening side wall is not necessarily formed at a side wall, but may be formed by a frame or the like as long as the air flow is not introduced into the delivery unit 14.

Further, although an example where the exhaust is carried out by the exhaust device 15c provided at the opening side wall in FIG. 5A, the present disclosure is not limited thereto. For example, the transfer section 15 may share the exhaust device 14b with the delivery unit 14, and the exhaust may be carried out by the exhaust device 14b. In this case, it is possible to reduce the number of components included in the substrate processing system 1, so that the effect of cost reduction can be achieved.

Furthermore, as illustrated in FIG. 5B, the transfer section 15 discharges the air in the vicinity of an axis of the substrate transfer device 17 into the exhaust line 31 by the exhaust devices 15d arranged along the extension direction of the transfer path 15a.

Then, the exhaust devices 31a respectively provided at the both ends of the exhaust line 31 are configured to exhaust the air in the vicinity of the axis of the substrate transfer device 17 discharged into the exhaust line 31, from both sides of the above-described opening side wall and facing side wall. Thus, it is possible to effectively suppress the air exhausted from the vicinity of the axis of the substrate transfer device 17 where particles are likely to be generated from being introduced into the delivery unit 14 and the transfer section 15.

Further, the exhaust by each of the exhaust devices 15c and 31a may be carried out in the same manner as the case already illustrated in FIG. 4B. That is, for example, as illustrated in FIG. 5C, the air flow may be guided toward the lower side of the carry-in/out chamber 21 while being rectified through the exhaust path 21b, and then, exhausted to the outside of the apparatus. Herein, the exhaust path 21b may be provided to serve as a collection pipe, or may be individually provided for each of the exhaust devices 15c and 31a (or 14b).

Figure 5D:
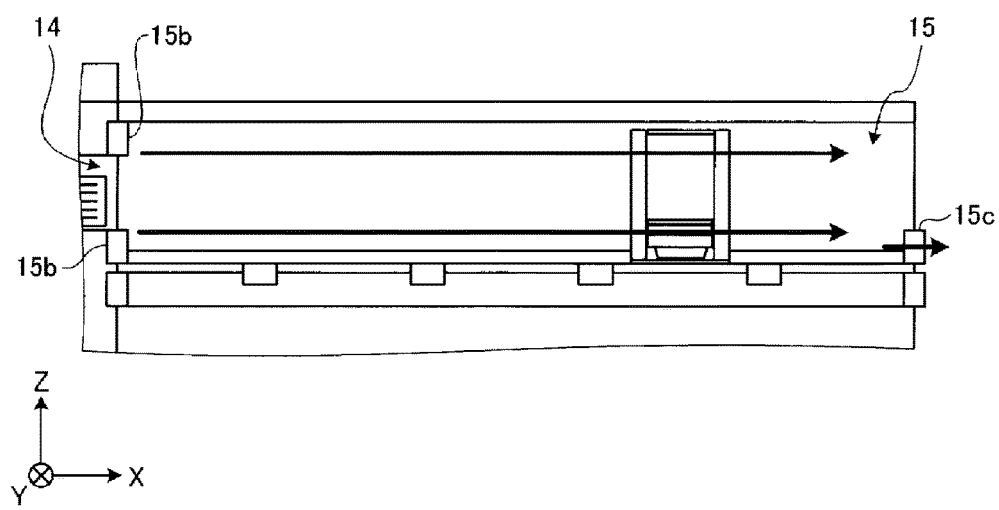
FIG. 5D is a schematic diagram illustrating a modification example of the configuration of the air supply/exhaust device of the transfer section.

Although there has been illustrated the case where the side flow in the transfer section 15 is formed in the substantially horizontal direction from the positive X-axis direction toward the negative X-axis direction, the side flow may be formed in the reverse direction as illustrated in FIG. 5D. FIG. 5D is a schematic diagram illustrating a modification example of the configuration of the air supply/exhaust device of the transfer section 15.

That is, as illustrated in FIG. 5D, in the transfer section 15, the clean air may be supplied by the FFU 15b provided at a side of the above-described opening side wall communicating with the delivery unit 14 and this air may be exhausted by the exhaust device 15c provided at a side of the facing side wall. As a result, the side flow may be formed in the substantially horizontal direction from the negative X-axis direction toward the positive X-axis direction.

Further, even in this case, it is desirable that the FFU 15b is provided to supply the air from, for example, an approximately entire surface in the vicinity of the opening of the delivery unit 14 opened at the opening side wall in order to form a substantially uniform air flow over the horizontal cross section of the transfer section 15.

Furthermore, although FIG. 5B illustrates the case where the multiple exhaust devices 15d are arranged along the extension direction of the transfer path 15a, in a modification example thereof, the substrate transfer device 17 may include an exhaust device in the vicinity of the axis thereof.

In this case, although illustration is omitted, it is possible to discharge the exhausted gas into the exhaust line 31 from the exhaust device provided in the substrate transfer device 17 by forming the transfer path 15a on, for example, a punching metal.

As described above, the substrate processing system 1 (corresponding to an example of "a substrate processing apparatus") in accordance with the present exemplary embodiment includes the carry-in/out chamber 21, the transfer section 15 (corresponding to an example of "a transfer chamber"), and the delivery unit 14 (corresponding to an example of "a delivery chamber").

In the carry-in/out chamber 21, the wafer W (corresponding to an example of "a substrate") is carried in and out from the carrier C. In the transfer section 15, there is formed the transfer path 15a through which the wafer W is delivered toward the processing unit 16 (corresponding to an example of "a substrate processing chamber") where a predetermined process is performed on the wafer W.

The delivery unit 14 is arranged between the carry-in/out chamber 21 and the transfer section 15. Further, the internal pressure of the delivery unit 14 is higher than the internal pressure of the carry-in/out chamber 21 and the internal pressure of the transfer section 15.

Therefore, according to the substrate processing system 1 of the present exemplary embodiment, it is possible to further suppress the particles from adhering to the wafer W.

Further, in the above-described exemplary embodiment, there has been illustrated the case where the air supply device is the FFU. However, the present disclosure is not limited thereto. For example, an air supply device configured to introduce clean air generated outside the substrate processing system 1 may be used.

Furthermore, in the above-described exemplary embodiment, there has been illustrated the case where a pair of the delivery unit 14 and the transfer section 15 is provided at two levels. However, the pair of the delivery unit 14 and the transfer section 15 may be provided at one level or three or more levels.

Moreover, in the above-described exemplary embodiment, there has been illustrated the case where the substrate is the wafer W. However, the substrate may include other substrates such as a glass substrate used for a liquid crystal display.

New effects or modification examples can be easily conceived by those skilled in the art. For this reason, the invention in its broader aspects is not limited to the specific details and representative exemplary embodiment shown and described herein. Accordingly, various changes and modifications may be made without departing from the spirit or scope of the general inventive concept as defined by the appended claims and their equivalents.

We claim:

1. A substrate processing apparatus comprising:
   a carry-in/out chamber where a substrate is carried in and out with respect to a carrier;
   a transfer chamber in which a transfer path for the substrate toward a substrate processing chamber, where a predetermined process is performed on the substrate, is formed; and
   a delivery chamber which is arranged between the carry-in/out chamber and the transfer chamber,
   wherein an internal pressure of the delivery chamber is higher than an internal pressure of the carry-in/out chamber and an internal pressure of the transfer chamber,
   the carry-in/out chamber is provided with a substrate transfer device which transfers the substrate between the carrier and the delivery chamber, and
   the delivery chamber is provided with a delivery table configured to support the substrate between the carry-in/out chamber and the transfer chamber.

2. The substrate processing apparatus of claim 1, further comprising:
   an air supply device provided above the delivery chamber and an exhaust device provided under the delivery chamber,
   wherein in the delivery chamber, a down flow of clean air is formed by the air supply device and the exhaust device.

3. The substrate processing apparatus of claim 2,
   wherein the transfer chamber is provided in plural in number at multiple levels along a height direction thereof, and
   the delivery chamber corresponding to the transfer chamber is in plural in number, and the delivery chambers are arranged at multiple levels along the height direction, and
   each of the delivery chambers is individually connected to the air supply device and the exhaust device.

4. The substrate processing apparatus of claim 2,
   wherein the delivery table includes placing shelves arranged at multiple levels along a height direction and each of the placing shelves is configured to place the substrates thereon.

5. The substrate processing apparatus of claim 1, further comprising:
   an exhaust path configured to rectify air exhausted from the delivery chamber and guide the air to an outside of the substrate processing apparatus.

6. A substrate processing apparatus comprising:
   a carry-in/out chamber where a substrate is carried in and out with respect to a carrier;
   a transfer chamber in which a transfer path for the substrate toward a substrate processing chamber, where a predetermined process is performed on the substrate, is formed; and
   a delivery chamber which is arranged between the carry-in/out chamber and the transfer chamber,
   wherein an internal pressure of the delivery chamber is higher than an internal pressure of the carry-in/out chamber and an internal pressure of the transfer chamber,
   wherein the transfer chamber includes a facing side wall facing the delivery chamber, and an air supply device arranged at the facing side wall,
   the transfer path is formed to be extended from a side of the delivery chamber to a side of the facing side wall, and
   a side flow of clean air flowing from the side of the facing side wall toward the side of the delivery chamber is formed within the transfer chamber by the air supply device arranged at the facing side wall and an exhaust device arranged at the side of the delivery chamber.

7. The substrate processing apparatus of claim 6,
   wherein the exhaust device provided at the side of the delivery chamber is arranged under the delivery chamber.

8. The substrate processing apparatus of claim 6,
   wherein the air supply device arranged at the facing side wall is configured to supply the air from an approximately entire surface of the facing side wall.

9. The substrate processing apparatus of claim 6, further comprising:
   a substrate transfer device provided within the transfer chamber and configured to transfer the substrate along the transfer path;
   an exhaust line provided under the transfer path along the transfer path; and
   exhaust devices respectively provided at both ends of the exhaust line,
   wherein the exhaust devices are configured to exhaust the air discharged from the vicinity of the substrate transfer device to the exhaust line from both sides of the delivery chamber and the facing side wall through the exhaust line.

10. A substrate processing apparatus comprising:
    a carry-in/out chamber where a substrate is carried in and out with respect to a carrier;
    a transfer chamber in which a transfer path for the substrate toward a substrate processing chamber, where a predetermined process is performed on the substrate, is formed; and
    a delivery chamber which is arranged between the carry-in/out chamber and the transfer chamber,
    wherein an internal pressure of the delivery chamber is higher than an internal pressure of the carry-in/out chamber and an internal pressure of the transfer chamber,
    wherein the transfer chamber includes:
    an opening side wall including an opening communicating with the delivery chamber;
    a facing side wall facing the opening side wall;
    an air supply device arranged in the vicinity of the opening of the opening side wall; and
    an exhaust device arranged at the facing side wall, and a side flow of clean air flowing from a side of the opening side wall toward a side of the facing side wall is formed within the transfer chamber by the air supply device at the opening side wall and the exhaust device at the facing side wall.

11. The substrate processing apparatus of claim 10, wherein the air supply device arranged at the opening side wall is configured to supply the air from an approximately entire surface in the vicinity of the opening.

\* \* \* \* \*